(12) United States Patent
Raievskyi et al.

(10) Patent No.: US 9,571,130 B2
(45) Date of Patent: Feb. 14, 2017

(54) METHOD AND APPARATUS FOR ENCODING AND DECODING IN ELECTRONIC DEVICE

(71) Applicant: Samsung Electronics Co., Ltd., Gyeonggi-do (KR)

(72) Inventors: Mykola Raievskyi, Cherkassy (UA); Oleg Kopysov, Kharkiv (UA); Oleksandr Kanievskyi, Kyiv (UA); Roman Gush, Okhtyrka (UA)

(73) Assignee: Samsung Electronics Co., Ltd., Suwon-si (KR)

( * ) Notice: Subject to any disclaimer, the term of this patent is extended or adjusted under 35 U.S.C. 154(b) by 69 days.

(21) Appl. No.: 14/594,915

(22) Filed: Jan. 12, 2015

(65) Prior Publication Data
US 2015/0200689 A1 Jul. 16, 2015

(30) Foreign Application Priority Data

Jan. 10, 2014 (KR) .................. 10-2014-0003180

(51) Int. Cl.
| H03M 13/00 | (2006.01) |
| H03M 13/13 | (2006.01) |
| H03M 13/15 | (2006.01) |
| H03M 13/37 | (2006.01) |
| H04L 1/00 | (2006.01) |

(52) U.S. Cl.
CPC ......... *H03M 13/616* (2013.01); *H03M 13/134* (2013.01); *H03M 13/1515* (2013.01); *H03M 13/373* (2013.01); *H04L 1/0045* (2013.01)

(58) Field of Classification Search
CPC ............ H03M 13/616; H03M 13/1515; H03M 13/036; H03M 13/373
See application file for complete search history.

(56) References Cited

U.S. PATENT DOCUMENTS

| 7,418,649 B2 | 8/2008 | Li | |
| 8,621,317 B1* | 12/2013 | Cypher | H03M 13/2909 |
| | | | 714/755 |
| 2010/0153822 A1 | 6/2010 | Huang et al. | |
| 2010/0218037 A1 | 8/2010 | Swartz et al. | |
| 2015/0128008 A1* | 5/2015 | Chatradhi | G06F 11/1076 |
| | | | 714/766 |

OTHER PUBLICATIONS

Extended European Search Report dated Jun. 5, 2015 in connection with European Patent Application No. 15150670.6; 17 pages.
Blomer, et al.; "An Xor-Based Erasure-Resilient Coding Scheme"; International Computer Science Institute; XP002659952; Aug. 1995; 21 pages.

(Continued)

*Primary Examiner* — Sam Rizk

(57) ABSTRACT

A method and an apparatus for encoding and decoding in an electronic device are provided. In a decoding method, at least one parity symbol is received. A Cauchy matrix is generated using the at least one parity symbol. A Cauchy submatrix is configured from the Cauchy matrix based on the number of at least one lost data symbol and an inverse matrix of the Cauchy submatrix is calculated. At least one parity symbol corresponding to the at least one lost data symbol is updated. The at least one lost data symbol is recovered using the updated at least one parity symbol.

20 Claims, 6 Drawing Sheets

(56) References Cited

OTHER PUBLICATIONS

Jin Li,; "The Efficient Implementation of Reed-Solomon High Rate Erasure Resilient Codes"; Microsoft Research, Communication and Collaboration; Mar. 18, 2005; pp. 1097-1100.

Al-Shaikhi, et al.; "Packet Loss Recovery Codes Based on Vandermonde Matrices and Shift Operators"; Department of Electrical and Computer Engineering; Dalhousie University; Halifax, Nova Scotia, Canada; Jul. 6-11, 2008; pp. 1058-1062.

\* cited by examiner

METHOD AND APPARATUS FOR ENCODING AND DECODING IN ELECTRONIC DEVICE

PRIORITY

The present application is related to and claims priority under 35 U.S.C. §119 to an application No. 10-2014-0003180 filed in the Korean Intellectual Property Office on Jan. 10, 2014 and assigned Serial, the contents of which are incorporated herein by reference.

TECHNICAL FIELD

The present invention generally relates to an encoding and decoding technology. More particularly, the present invention relates to a method and an apparatus for recovering lost or erased data symbols using an inverse matrix with respect to a submatrix of a Cauchy matrix in an electronic device.

BACKGROUND

In a communication system and a service, for example, digital video broadcasting (DVB), an asymmetric digital subscriber line (ADSL), a very high-data rate digital subscriber line (VDSL), WiMax, Wi-Fi, or the like, forward error correction (FEC) is a technology for data packet erasures control in data transmission via an unreliably or nosy communication channel. In the FEC technique, a transmitter encodes a data packet in a redundant way using an FEC code. Redundant data (such as a parity bit) allows a receiver to often detect a limited number of erasure data among transmission data packet in order to recover an erased data packet without retransmission. The FEC provides an ability capable of recovering an erased data packet without a reverse channel for requesting retransmission of a data packet to a receiver, but requires fixed and high forward channel bandwidth costs. Also, the FEC is applied under a circumstance where retransmission is expensive or impossible when a data packet is transmitted to a plurality of users during a multi-cast mode.

Conventionally, to solve this problem, a method of using a lookup table before encoding and decoding operations has been used, but this lookup table setting is used for a mathematical operation in a Galois Field, and using a lookup table for the mathematical operation may slow down the speed of encoding and decoding processes. Also, a multiblock FEC scheme uses a generation matrix (G) which is a Cauchy matrix form, but a Cauchy matrix form of a generation matrix determined in advance reduces power of the FEC scheme due to repetition of redundant data (symbol) in the multiblock FEC scheme. Also, in case of calculating an inverse matrix of a generation matrix and decoding an original message from an encoded message, a procedure designed for calculating an inverse matrix of a generation matrix (determinant calculation, vector multiplication, and elements addition) is complicated and a time consumed in a data decoding step may increase.

SUMMARY

To address the above-identified deficiencies, it is a primary object to provide a method and an apparatus for improving the speed of encoding and decoding processes.

Another aspect of the present disclosure is to provide a method and an apparatus for reducing complexity of encoding and decoding procedures.

Still another aspect of the present disclosure is to provide a method and an apparatus for reducing power reduction by repetition of redundant data in a multiblock FEC scheme.

In accordance with an aspect of the present disclosure, a decoding method in an electronic device is provided. The method includes receiving at least one parity symbol. The method also includes generating a Cauchy matrix using the at least one parity symbol. The method further includes configuring a Cauchy submatrix from the Cauchy matrix based on the number of at least one lost data symbol to calculate an inverse matrix of the Cauchy submatrix. The method includes updating at least one parity symbol corresponding to the at least one lost data symbol. The method also includes recovering the at least one lost data symbol using the updated at least one parity symbol.

In various embodiments, each element of the inverse matrix of the Cauchy submatrix is determined by a ratio of a determinant of the Cauchy matrix and a determinant of the Cauchy submatrix.

In various embodiments, each element of the inverse matrix of the Cauchy submatrix is defined by Equation below.

$$A'_{i,j} = \frac{\det(A_{j,i})}{\det(A)}, i, j = 1, \ldots, s,$$

where s is a size of the inverse matrix of the Cauchy submatrix, and $A_{j,i}$ is a matrix excluding a j-th row and an i-column in the Cauchy matrix A.

In various embodiments, a determinant det (A) of the Cauchy matrix is defined by Equation below.

$$\det A = \frac{\prod_{0 \le i < j < n}(x_i + x_j)(y_i + y_j)}{\prod_{0 \le i,j < n}(x_i + x_j)}$$

where $x_i$ and $y_j$ are elements of a Galois Field, k is a size of an information message or a length of an information bit, n is a size of an encoded information message or a length of an encoded bit, and i and j are indexes indicating array elements.

In various embodiments, each element of the inverse matrix of the Cauchy submatrix is defined by Equation below in order to express a symbol in a Galois Field.

$$a_{ij} = \frac{\prod_{k=0}^{s-1}(x_j + y_k) \cdot \prod_{k=0}^{s-1}(x_y + y_j)}{(x_j + y_i) \cdot \prod_{k=0,\ldots,s-1, k \ne j}(x_j + x_k) \cdot \prod_{k=0,\ldots,s-1, k \ne i}(y_i + y_k)}$$

where s is a size of the Cauchy submatrix, and $a_{ij}$ is an element of an inverse matrix of the Cauchy submatrix that is positioned at an i-th row and a j-th column.

In various embodiments, the updated at least one parity symbol is generated by excluding parity symbols corresponding to received data symbols from the at least one parity symbol.

In various embodiments, the at least one lost data symbol is generated by multiplying the inverse matrix of the Cauchy submatrix by the updated at least one parity symbol.

In accordance with another aspect of the present invention, an encoding method in an electronic device is provided. The method includes. receiving at least one message vector. The method also includes encoding the at least one message vector using a generation matrix of a Cauchy matrix form for preventing repetition of redundant data. The method further includes outputting the encoded message vectors.

In various embodiments, the generation matrix is defined by Equation below.

$$GM = \begin{bmatrix} 1 & 0 & \ldots & 0 & 0 \\ 0 & 1 & \ldots & 0 & 0 \\ \ldots & \ldots & \ldots & \ldots & \ldots \\ 0 & 0 & \ldots & 1 & 0 \\ 0 & 0 & \ldots & 0 & 1 \\ \frac{1}{x_0+y_0} & \frac{1}{x_0+y_1} & \ldots & \frac{1}{x_0+y_{k-2}} & \frac{1}{x_0+y_{k-1}} \\ \frac{1}{x_1+y_0} & \frac{1}{x_1+y_1} & \ldots & \frac{1}{x_0+y_{k-2}} & \frac{1}{x_0+y_{k-1}} \\ \ldots & \ldots & \ldots & \ldots & \ldots \\ \frac{1}{x_{n-k-2}+y_0} & \frac{1}{x_{n-k-2}+y_1} & \ldots & \frac{1}{x_{n-k-2}+y_{k-2}} & \frac{1}{x_{n-k-2}+y_{k-1}} \\ \frac{1}{x_{n-k-1}+y_0} & \frac{1}{x_{n-k-1}+y_1} & \ldots & \frac{1}{x_{n-k-1}+y_{k-2}} & \frac{1}{x_{n-k-1}+y_{k-1}} \end{bmatrix}$$

where x, y are elements of a Galois Field, k is a size of an information bit, n is a size of a parity bit, and i and j are array elements.

In various embodiments, the generation matrix meets a condition of Equation below in order to prevent repetition of redundant data.

$$\forall i \in \{0 \ldots n-k-1\}, \forall j \in \{0 \ldots k-1\}: x_i + y_j \neq 0;$$

$$\forall i, j \in \{0 \ldots n-k-1\}, i \neq j: x_i \neq x_j; \forall i, j \in \{0 \ldots k-1\}, i \neq j; y_i \neq y_j$$

In accordance with still another aspect of the present invention, a decoding apparatus in an electronic device is provided. The apparatus includes a Cauchy matrix generator configured to receive at least one parity symbol to generate a Cauchy matrix using the at least one parity symbol. The apparatus also includes an inverse matrix calculator configured to configure a Cauchy submatrix from the Cauchy matrix based on the number of at least one lost data symbol to calculate an inverse matrix of the Cauchy submatrix. The apparatus further includes a parity updater configured to update at least one parity symbol corresponding to the at least one lost data symbol. The apparatus includes a data symbol recovery unit configured to recover the at least one lost data symbol using the updated at least one parity symbol.

In various embodiments, each element of the inverse matrix of the Cauchy submatrix is determined by a ratio of a determinant of the Cauchy matrix and a determinant of the Cauchy submatrix.

In various embodiments, each element of the inverse matrix of the Cauchy submatrix is defined by Equation below.

$$A'_{i,j} = \frac{\det(A_{j,i})}{\det(A)}, i, j = 1, \ldots, s,$$

where s is a size of the inverse matrix of the Cauchy submatrix, and $A_{j,i}$ is a matrix excluding a j-th row and an i-column in the Cauchy matrix A.

In various embodiments, a determinant det (A) of the Cauchy matrix is defined by Equation below.

$$\det A = \frac{\prod_{0 \leq i < j < n} (x_i + x_j)(y_i + y_j)}{\prod_{0 \leq i,j < n} (x_i + y_j)}$$

where $x_i$ and $y_j$ are elements of a Galois Field, k is a size of an information message or a length of an information bit, n is a size of an encoded information message or a length of an encoded bit, and i and j are indexes indicating array elements.

In various embodiments, each element of the inverse matrix of the Cauchy submatrix is defined by Equation below in order to express a symbol in a Galois Field.

$$a_{ij} = \frac{\prod_{k=0}^{s-1}(x_j + y_k) \cdot \prod_{k=0}^{s-1}(x_y + y_j)}{(x_j + y_i) \cdot \prod_{k=0,\ldots,s-1,k \neq j}(x_j + x_k) \cdot \prod_{k=0,\ldots,s-1,k \neq i}(y_i + y_k)}$$

where s is a size of the Cauchy submatrix, and $a_{ij}$ is an element of an inverse matrix of the Cauchy submatrix that is positioned at an i-th row and a j-th column.

In various embodiments, the updated at least one parity symbol is generated by excluding parity symbols corresponding to received data symbols from the at least one parity symbol.

In various embodiments, the at least one lost data symbol is generated by multiplying the inverse matrix of the Cauchy submatrix by the updated at least one parity symbol.

In accordance with yet another aspect of the present invention, an encoding apparatus in an electronic device is provided. The apparatus is configured to receive at least one message vector. The apparatus is also configured to encode the at least one message vector using a generation matrix of a Cauchy matrix form for preventing repetition of redundant data. The apparatus is further configured to output the encoded message vectors.

In various embodiments, the generation matrix may be defined by Equation below.

$$GM = \begin{bmatrix} 1 & 0 & \ldots & 0 & 0 \\ 0 & 1 & \ldots & 0 & 0 \\ \ldots & \ldots & \ldots & \ldots & \ldots \\ 0 & 0 & \ldots & 1 & 0 \\ 0 & 0 & \ldots & 0 & 1 \\ \frac{1}{x_0+y_0} & \frac{1}{x_0+y_1} & \ldots & \frac{1}{x_0+y_{k-2}} & \frac{1}{x_0+y_{k-1}} \\ \frac{1}{x_1+y_0} & \frac{1}{x_1+y_1} & \ldots & \frac{1}{x_0+y_{k-2}} & \frac{1}{x_0+y_{k-1}} \\ \ldots & \ldots & \ldots & \ldots & \ldots \\ \frac{1}{x_{n-k-2}+y_0} & \frac{1}{x_{n-k-2}+y_1} & \ldots & \frac{1}{x_{n-k-2}+y_{k-2}} & \frac{1}{x_{n-k-2}+y_{k-1}} \\ \frac{1}{x_{n-k-1}+y_0} & \frac{1}{x_{n-k-1}+y_1} & \ldots & \frac{1}{x_{n-k-1}+y_{k-2}} & \frac{1}{x_{n-k-1}+y_{k-1}} \end{bmatrix}$$

where x, y are elements of a Galois Field, k is a size of an information bit, n is a size of a parity bit, and i, j are array elements.

In various embodiments, the generation matrix meets a condition of Equation below in order to prevent repetition of redundant data.

$$\forall i \in \{0 \ldots n-k-1\}, \forall j \in \{0 \ldots k-1\}: x_i + y_j \neq 0;$$

$$\forall i,j \in \{0 \ldots n-k-1\}, i \neq j: x_i \neq x_j; \forall i,j \in \{0 \ldots k-1\}, i \neq j; y_i \neq y_j$$

Other aspects, advantages and salient features of the invention will become apparent to those skilled in the art from the following detailed description, which, taken in conjunction with the annexed drawings, discloses exemplary embodiments of the invention.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, like reference numerals will be understood to refer to like parts, components and structures.

DETAILED DESCRIPTION

FIGS. 1 through 5B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device. The following description with reference to the accompanying drawings is provided to assist in a comprehensive understanding of exemplary embodiments of the disclosure as defined by the claims and their equivalents. Also, in the case where descriptions of well-known functions and constructions may obscure the spirit of the present disclosure unnecessarily, detailed descriptions thereof are omitted. The terms and words used in the following description are terms defined with consideration of a function in the present disclosure and may change depending on intention or practice, etc. of a user and an operator. Therefore, definition thereof should be made based on content throughout the present specification.

Hereinafter, a method and an apparatus for encoding and decoding in an electronic device 10 are described.

Various embodiments of the present disclosure are applicable to a reed-solomon decoding algorithm for erasure channels capable of recovering k source elements from a set of k received elements. Recovering a source element is based on a basic attribute of a Cauchy matrix where a submatrix of the Cauchy matrix is converted inversely.

However, various embodiments of the present disclosure are not limited to the reed-solomon decoding algorithm, and are applicable to a decoding algorithm based on an FEC technology recovering k source elements from a set of k received elements.

Figure 1:
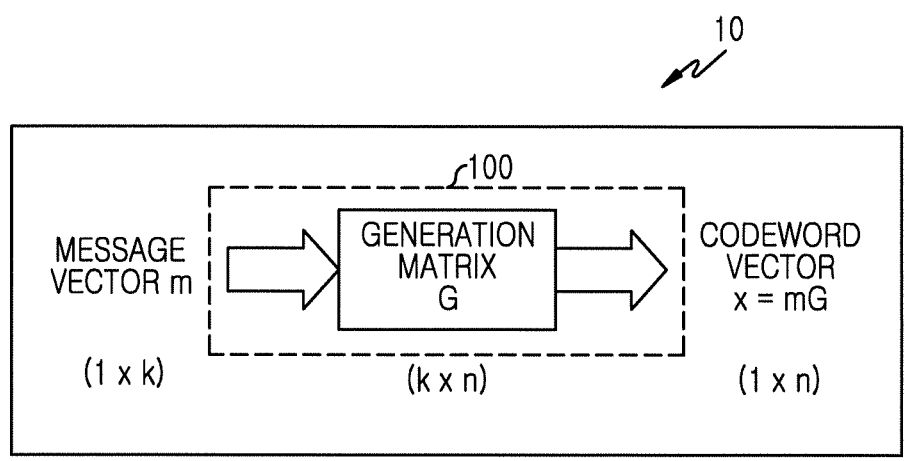
FIG. 1 is a view illustrating an example encoding apparatus according to this disclosure.

FIG. 1 is a view illustrating an example encoding apparatus 100 according to this disclosure.

Referring to FIG. 1, the encoding apparatus 100 outputs an input message vector (m) (for example, an information bit string having a size of 1*k) as a codeword vector (x=m*G) (an encoded bit string having a size of 1*n) using a generation matrix G having a size of k*n. Here, k<n. The codeword vector is configured using a message vector and a parity vector.

In various embodiments, a plurality of message vectors are parallel-processed, so that a plurality of codeword vectors is output.

Also, in various embodiments, at least a portion of a plurality of codeword vectors is erased. The erased some codeword vectors is recovered by a decoding apparatus and decoded using an original message vector.

In various embodiments of the present disclosure, the generation matrix G is defined by Equation (1) in order to prevent repetition of redundant data.

$$GM = \begin{bmatrix} 1 & 0 & \ldots & 0 & 0 \\ 0 & 1 & \ldots & 0 & 0 \\ \ldots & \ldots & \ldots & \ldots & \ldots \\ 0 & 0 & \ldots & 1 & 0 \\ 0 & 0 & \ldots & 0 & 1 \\ \frac{1}{x_0+y_0} & \frac{1}{x_0+y_1} & \ldots & \frac{1}{x_0+y_{k-2}} & \frac{1}{x_0+y_{k-1}} \\ \frac{1}{x_1+y_0} & \frac{1}{x_1+y_1} & \ldots & \frac{1}{x_0+y_{k-2}} & \frac{1}{x_0+y_{k-1}} \\ \ldots & \ldots & \ldots & \ldots & \ldots \\ \frac{1}{x_{n-k-2}+y_0} & \frac{1}{x_{n-k-2}+y_1} & \ldots & \frac{1}{x_{n-k-2}+y_{k-2}} & \frac{1}{x_{n-k-2}+y_{k-1}} \\ \frac{1}{x_{n-k-1}+y_0} & \frac{1}{x_{n-k-1}+y_1} & \ldots & \frac{1}{x_{n-k-1}+y_{k-2}} & \frac{1}{x_{n-k-1}+y_{k-1}} \end{bmatrix} \quad (1)$$

where x, y are elements of a Galois Field, k is a size of an information bit, n is a size of a parity bit, and i, j are array elements.

The generation matrix G meets a condition of Equation (2) below in order to prevent repetition of redundant data.

$$\forall i \in \{0 \ldots n-k-1\}, \forall j \in \{0 \ldots k-1\}: x_i + y_j = 0;$$

$$\forall i,j \in \{0 \ldots n-k-1\}, i \neq j: x_i \neq x_j; \forall i,j \in \{0 \ldots k-1\}, i \neq j; \\ y_i \neq y_j \quad (2)$$

For example, for all i in a range of $0 \leq i \leq n-k-1$ and all j in a range of $0 \leq j \leq n-k-1$, $x_i + y_j = 0$ is met, for all i and j in a range of $0 \leq i,j \leq n-k-1$, $x_i \neq x_j$ is met, and for all i and j in a range of $0 \leq i, j \leq k-1$, $y_i \neq y_j$ is met, so that repetition of redundant data in the generation matrix G is prevented.

Figure 2:
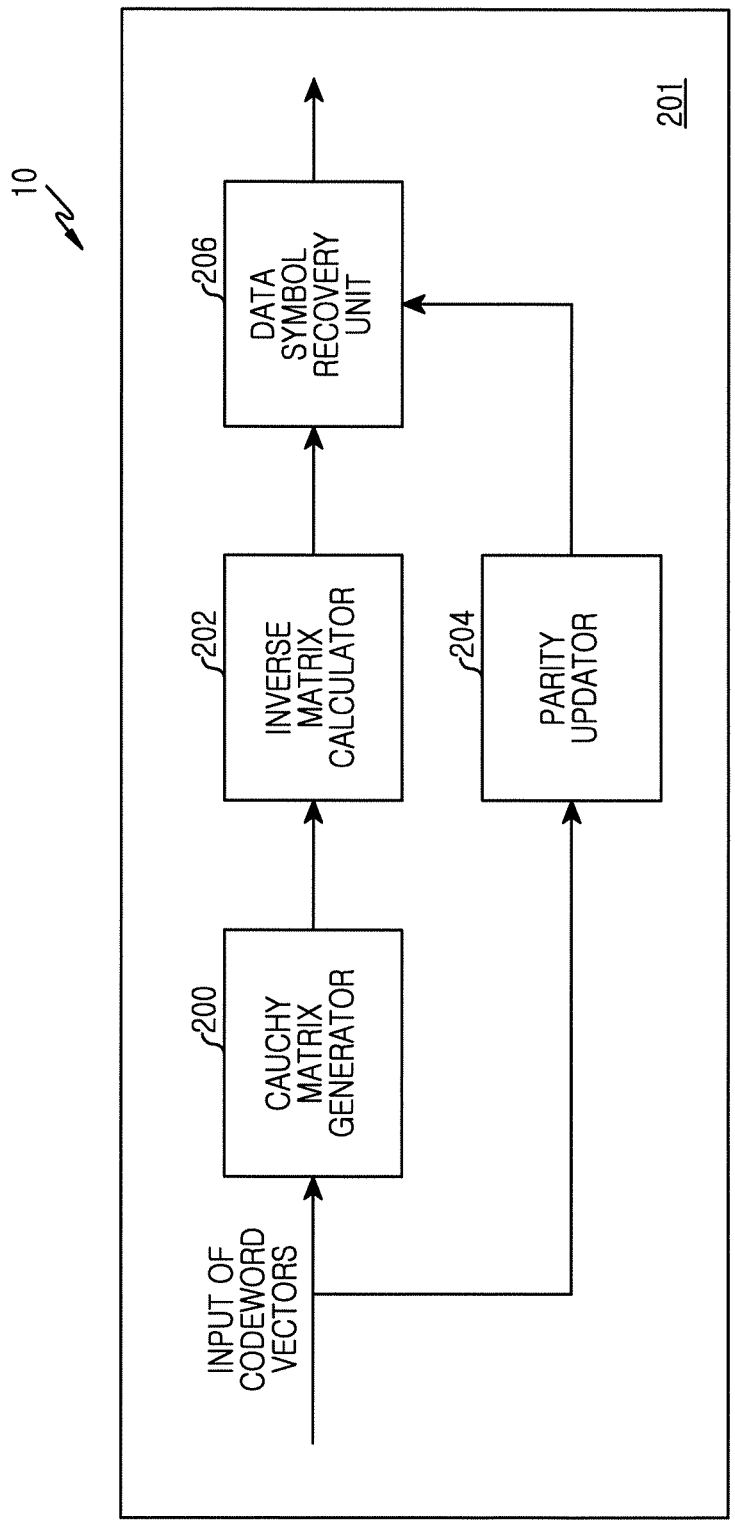
FIG. 2 is a block diagram illustrating an example decoding apparatus according to this disclosure.

FIG. 2 is a block diagram illustrating an example decoding apparatus 201 according to this disclosure.

Referring to FIG. 2, the decoding apparatus 201 includes a Cauchy matrix generator 200, an inverse matrix calculator 202, a parity updater 204, and a data symbol recovery unit 206.

The Cauchy matrix generator 200 receives at least one codeword vector from the encoding apparatus 100, collect data symbols and parity symbols included in the codeword vector, and generate a Cauchy matrix A. For example, the Cauchy matrix is configured using parity symbols or a combination of data symbols and parity symbols. In various embodiments, the Cauchy matrix is a Cauchy matrix determined in advance or a default Cauchy matrix.

The inverse matrix calculator 202 calculates an inverse matrix $A'_{i,j}$ of a Cauchy submatrix using a determinant det (A) of a Cauchy matrix generated by the Cauchy matrix generator 200 and a determinant det $(A_{j,i})$ of a submatrix $A_{j,i}$ where at least one row j and at least one column i have been deleted (or excluded) from the Cauchy matrix.

For example, an inverse matrix $A'_{j,i}$ of a Cauchy submatrix is determined by a ratio of the determinant det (A) of the Cauchy matrix and the determinant det $(A_{j,i})$ of the submatrix as in Equation (3).

$$A' = \frac{\det(A_{j,i})}{\det(A)}, i, j = 1, \ldots, s, \quad (3)$$

where s is a size of the inverse matrix of the Cauchy submatrix, and $A_{j,i}$ is a matrix excluding a j-th row and an i-column in the Cauchy matrix A.

A determinant det (A) of the Cauchy matrix is defined by Equation (4) below.

$$\det A = \frac{\prod_{0 \leq i < j < n} (x_i + x_j)(y_i + y_j)}{\prod_{0 \leq i,j < n} (x_i + y_j)} \quad (4)$$

where $x_i$ and $y_j$ are elements of a Galois Field, k is a size of an information message or a length of an information bit, n is a size of an encoded information message or a length of an encoded bit, and i, j are indexes indicating array elements.

Each element of the inverse matrix of the Cauchy submatrix is defined by Equation (5) below in order to express a symbol in a Galois Field.

$$a_{ij} = \frac{\prod_{k=0}^{s-1}(x_j + y_k) \cdot \prod_{k=0}^{s-1}(x_k + y_j)}{(x_j + y_i) \cdot \prod_{k=0,\ldots,s-1, k \neq j}(x_j + x_k) \cdot \prod_{k=0,\ldots,s-1, k \neq i}(y_i + y_k)} \quad (5)$$

where s is a size of the Cauchy submatrix, and $a_{ij}$ is an element of an inverse matrix of the Cauchy submatrix that is positioned at an i-th row and a j-th column.

In various embodiments of the present disclosure, a technology for calculating an inverse matrix of a Cauchy submatrix is an important concept, and provides possibility for implementing a new solution for protecting information from a packet loss. Also, according to various embodiments of the present disclosure, the technology for calculating an inverse matrix of a Cauchy submatrix is used for expressing symbols in a Galois Field.

The parity updater 204 updates content of received parity symbols by excluding information regarding received data symbols. Therefore, the updated parity symbols includes only information regarding a data symbol lost or erased by a transmitter.

The data symbol recovery unit 206 multiplies an inverse matrix of the Cauchy submatrix from the inverse matrix calculator 202 by the updated parity symbols from the parity updater 204 to output data symbols lost or erased by the transmitter.

Figure 3:
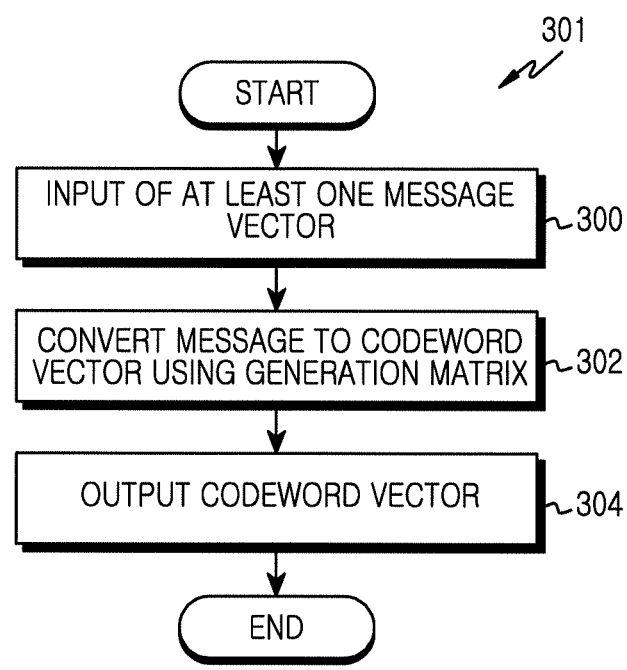
FIG. 3 is a flowchart illustrating an example method of encoding according to this disclosure.

FIG. 3 is a flowchart illustrating an example method 301 of encoding according to this disclosure.

Referring to FIG. 3, an encoding apparatus 100 receives at least one message vector in step 300, converts the message vector to a codeword vector using a generation matrix G in step 302, and outputs the codeword vector in step 304. The codeword vector is configured using a message vector and a parity vector. In various embodiments of the present disclosure, the generation matrix G is defined by Equation (1) above in order to prevent repetition of redundant data.

Figure 4:
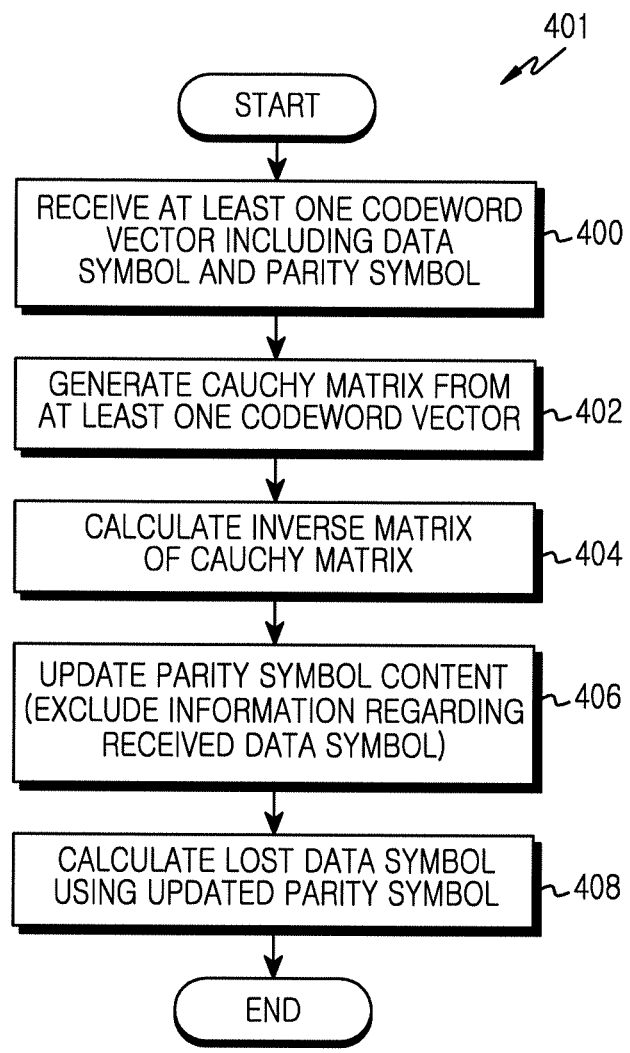
FIG. 4 is a flowchart illustrating an example method of decoding according to this disclosure.

FIG. 4 is a flowchart illustrating an example method 401 of decoding according to this disclosure.

Referring to FIG. 4, the decoding apparatus 201 receives at least one codeword vector including data symbols and parity symbols from the encoding apparatus 100 in step 400, and collects the data symbols and the parity symbols included in the codeword vector to generate a Cauchy matrix A in step 402. For example, the Cauchy matrix is configured using parity symbols or a combination of data symbols and parity symbols. In various embodiments, the Cauchy matrix is a Cauchy matrix determined in advance or a default Cauchy matrix.

The decoding apparatus 201 calculates an inverse matrix $A'_{j,i}$ of a Cauchy submatrix using a determinant det (A) of a generated Cauchy matrix and a determinant det $(A_{j,i})$ of a submatrix $A_{j,i}$, where at least one row j and at least one column i have been deleted (or excluded) from the Cauchy matrix in step 404. For example, an inverse matrix $A'_{j,i}$ of a Cauchy submatrix is determined by a ratio of the determinant det (A) of the Cauchy matrix and the determinant det $(A_{j,i})$ of the submatrix as in Equation (3).

The decoding apparatus 201 excludes information regarding received data symbols to update content of received parity symbols in step 406. Therefore, the updated parity symbols includes only information regarding a data symbol lost or erased by a transmitter.

The decoding apparatus multiplies an inverse matrix of the Cauchy submatrix by the updated parity symbols to calculate data symbols lost or erased by the transmitter in step 408.

Figure 5A:
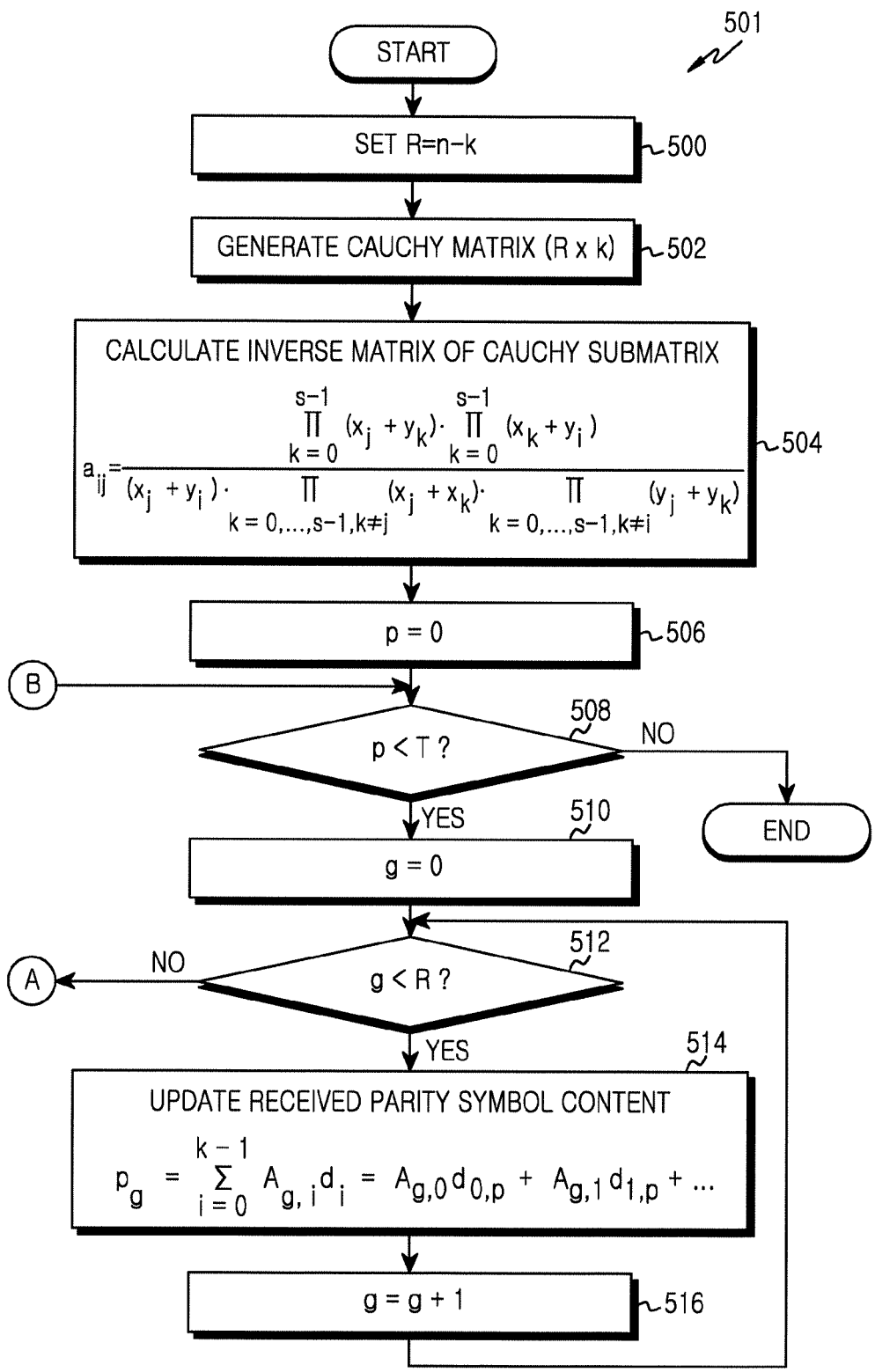
FIGS. 5A and 5B are detailed flowcharts illustrating an example method of decoding according to this disclosure.
Figure 5B:
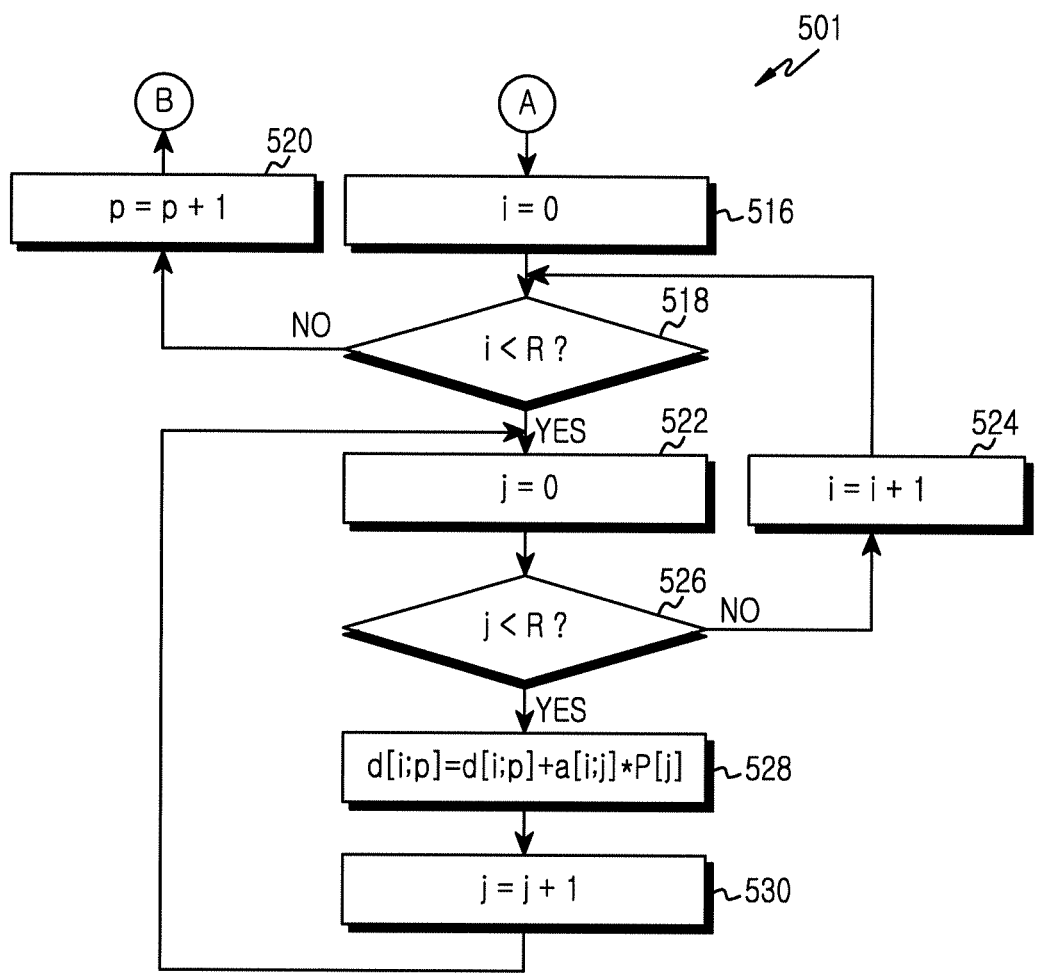

FIGS. 5A and 5B are a details of a flowchart illustrating an example method 501 of decoding according to this disclosure.

Referring to FIGS. 5A and 5B, the decoding apparatus 201 sets R=n−k in step 500, and generates a Cauchy matrix having a size of R*k in step 502. Here, n is a length or size of an encoded message, k is a length or size of an information message, and n−k is a length or size of parity information used when an information message is recovered.

In various embodiments, the Cauchy matrix having a size of R*k is configured using a plurality of input parity data (or symbols) or a combination of information data and parity data.

The decoding apparatus 201 calculates an inverse matrix of a Cauchy submatrix in step 504. Each element of the inverse matrix of the Cauchy submatrix is determined by Equation (5). In the inverse matrix of the Cauchy submatrix, a column index is determined by an index of a received parity symbol, and a row index is determined by an index of a lost data symbol.

For example, if two data symbols are lost, two rows and two columns are excluded from a Cauchy matrix. As a result, four determinants and four elements of the inverse matrix of the Cauchy submatrix are determined.

The decoding apparatus sets p=0 in step 506. Here, p is a parity element of a matrix.

When p<T in step 508, the decoding apparatus proceeds to step 510 to set g=0. Here, g is an index and T is a threshold. In contrast, when p>=T, the decoding procedure of the present disclosure ends.

When g<R in step 512, the decoding apparatus 201 proceeds to step 514 to update content of a received symbol. For example, the decoding apparatus 201 updates the parity symbol content as in Equation (6). In contrast, when g>=R in step 512, the decoding apparatus 201 proceeds to step 516.

$$p_g \sum_{i=0}^{k-1} A_{g,i} d_i = A_{g,0} d_{0,p} + A_{g,1} d_{1,p} + \ldots \quad (6)$$

where d is an information symbol that is known or may not be known, k is a row number, and A is an element of a generation matrix.

The decoding apparatus sets g=g+1 in step 515.

The decoding apparatus 201 sets i=0 in step 516. i is an index.

When i<R in step 518, the decoding apparatus 201 proceeds to step 522 to set j=0. j is an index. In contrast, when i>=R in step 518, the decoding apparatus 201 proceeds to step 520 to set p=p+1.

When j<R in step 526, the decoding apparatus 201 proceeds to step 528 to recover lost data. For example, the decoding apparatus 201 updates parity symbol content as in Equation (7). In contrast, when j>=R in step 526, the decoding apparatus 201 proceeds to step 524 to set i=j+1.

$$d[i;p]=d[i;p]+a[i;j]*P[j] \quad (7)$$

The decoding apparatus 201 sets j=j+1 in step 539.

As described above, the present disclosure improves a speed of encoding and decoding processes, reduce complexity of encoding and decoding procedures, and reduce power reduction due to repetition of redundant data in a multiblock FEC scheme by determining information regarding a lost or erased data symbol using an inverse matrix of a submatrix of a Cauchy matrix.

Although the disclosure has been shown and described with reference to certain exemplary embodiments thereof, it will be understood by those skilled in the art that various changes in form and details is made therein without departing from the spirit and scope of the disclosure as defined by the appended claims and their equivalents. Therefore, the scope of the present disclosure should not be limited to the above-described embodiments but should be determined by not only the appended claims but also the equivalents thereof.

What is claimed is:

1. A decoding method in an electronic device comprising:
receiving at least one parity symbol;
generating a matrix comprising a plurality of elements in a form of a Cauchy matrix based on the at least one parity symbol;
configuring a Cauchy submatrix from the matrix based on a number of at least one lost data symbol to calculate an inverse matrix of the Cauchy submatrix;
updating the at least one parity symbol corresponding to the number of at least one lost data symbol by multiplying the inverse matrix of the Cauchy submatrix to the at least one parity symbol; and
recovering the number of at least one lost data symbol using the updated at least one parity symbol,
wherein each of the plurality of elements is determined based on at least one of first sets including Galois Field elements and at least one of second sets including Galois Field elements, and
wherein each of the Galois Field elements included in the at least one of first sets is different from each other and each of the Galois Field elements included in the at least one of second sets is different from each other.

2. The method of claim 1, wherein each element of the inverse matrix of the Cauchy submatrix is determined by a ratio of a determinant of the Cauchy matrix and a determinant of the Cauchy submatrix.

3. The method of claim 2, wherein each element of the inverse matrix of the Cauchy submatrix is defined by Equation below:

$$A'_{i,j} = \frac{\det(A_{j,i})}{\det(A)}, i, j = 1, \ldots, s,$$

where s is a size of the inverse matrix of the Cauchy submatrix, and $A_{j,i}$ is a matrix excluding a j-th row and an i-column in the Cauchy matrix A.

4. The method of claim 3, wherein a determinant det (A) of the Cauchy matrix is defined by Equation below:

$$\det A = \frac{\prod_{0 \leq i < j < n} (x_i + x_j)(y_i + y_j)}{\prod_{0 \leq i,j < n} (x_i + y_j)}$$

where $x_i$ and $y_j$ are elements of a Galois Field, k is a size of an information message or a length of an information bit, n is a size of an encoded information message or a length of an encoded bit, and i, j are indexes indicating array elements.

5. The method of claim 1, wherein each element of the inverse matrix of the Cauchy submatrix is defined by Equation below in order to express a symbol in a Galois Field:

$$a_{ij} = \frac{\prod_{k=0}^{s-1}(x_j + y_k) \cdot \prod_{k=0}^{s-1}(x_k + y_j)}{(x_j + y_i) \cdot \prod_{k=0,\ldots,s-1, k \neq j}(x_j + x_k) \cdot \prod_{k=0,\ldots,s-1, k \neq i}(y_i + y_k)}$$

where s is a size of the Cauchy submatrix, and $a_{ij}$ is an element of an inverse matrix of the Cauchy submatrix that is positioned at an i-th row and a j-th column.

6. The method of claim 1, wherein the updated at least one parity symbol is generated by excluding parity symbols corresponding to received data symbols from the at least one parity symbol.

7. The method of claim 1, wherein the number of at least one lost data symbol is generated by multiplying the inverse matrix of the Cauchy submatrix by the updated at least one parity symbol.

8. An encoding method in an electronic device, the method comprising:
  receiving at least one message vector;
  encoding the at least one message vector in parallel using a generation matrix comprising a plurality of elements in a form of a Cauchy matrix form configured to prevent repetition of redundant data;
  converting the at least one message vector to at least one codeword vector comprising the at least one message vector and a parity vector based on the encoded the at least one message vector; and
  outputting the at least one codeword vector,
  wherein each of the plurality of elements is determined based on at least one of first sets including Galois Field elements and at least one of second sets including Galois Field elements, and
  wherein each of the Galois Field elements included in the at least one of first sets is different from each other and each of the Galois Field elements included in the at least one of second sets is different from each other.

9. The method of claim 8, wherein the generation matrix is defined by Equation below:

$$GM = \begin{bmatrix} 1 & 0 & \cdots & 0 & 0 \\ 0 & 1 & \cdots & 0 & 0 \\ \cdots & \cdots & \cdots & \cdots & \cdots \\ 0 & 0 & \cdots & 1 & 0 \\ 0 & 0 & \cdots & 0 & 1 \\ \frac{1}{x_0+y_0} & \frac{1}{x_0+y_1} & \cdots & \frac{1}{x_0+y_{k-2}} & \frac{1}{x_0+y_{k-1}} \\ \frac{1}{x_1+y_0} & \frac{1}{x_1+y_1} & \cdots & \frac{1}{x_0+y_{k-2}} & \frac{1}{x_0+y_{k-1}} \\ \cdots & \cdots & \cdots & \cdots & \cdots \\ \frac{1}{x_{n-k-2}+y_0} & \frac{1}{x_{n-k-2}+y_1} & \cdots & \frac{1}{x_{n-k-2}+y_{k-2}} & \frac{1}{x_{n-k-2}+y_{k-1}} \\ \frac{1}{x_{n-k-1}+y_0} & \frac{1}{x_{n-k-1}+y_1} & \cdots & \frac{1}{x_{n-k-1}+y_{k-2}} & \frac{1}{x_{n-k-1}+y_{k-1}} \end{bmatrix}$$

where x, y are elements of a Galois Field, k is a size of an information bit, n is a size of a parity bit, and i, j are array elements.

10. The method of claim 9, wherein the generation matrix meets a condition of Equation below in order to prevent repetition of redundant data:

$\forall i \in \{0 \ldots n-k-1\}, \forall j \in \{0 \ldots k-1\}: x_i + y_j \neq 0;$ and $\forall i,j \in \{0 \ldots n-k-1\}, i \neq j: x_i \neq x_j; \forall i,j \in \{0 \ldots k-1\}, i \neq j; y_i \neq y_j.$ 11. A decoding apparatus in an electronic device, the decoding apparatus comprising:
  a Cauchy matrix generator configured to receive at least one parity symbol to generate a Cauchy matrix using the at least one parity symbol;
  an inverse matrix calculator configured to configure a matrix comprising a plurality of elements in a form of a Cauchy submatrix from the Cauchy matrix based on a number of at least one lost data symbol to calculate an inverse matrix of the Cauchy submatrix;
  a parity updater configured to update at least one parity symbol corresponding to the number of at least one lost data symbol by multiplying the inverse matrix of the Cauchy submatrix to the at least one parity symbol; and
  a data symbol recovery unit configured to recover the number of at least one lost data symbol using the updated at least one parity symbol,
  wherein each of the plurality of elements is determined based on at least one of first sets including Galois Field elements and at least one of second sets including Galois Field elements, and
  wherein each of the Galois Field elements included in the at least one of first sets is different from each other and each of the Galois Field elements included in the at least one of second sets is different from each other.

12. The decoding apparatus of claim 11, wherein each element of the inverse matrix of the Cauchy submatrix is determined by a ratio of a determinant of the Cauchy matrix and a determinant of the Cauchy submatrix.

13. The decoding apparatus of claim 12, wherein each element of the inverse matrix of the Cauchy submatrix is defined by Equation below:

$$A'_{i,j} = \frac{\det(A_{j,i})}{\det(A)}, i, j = 1, \ldots, s,$$

where s is a size of the inverse matrix of the Cauchy submatrix, and $A_{j,i}$ is a matrix excluding a j-th row and an i-column in the Cauchy matrix A.

14. The decoding apparatus of claim 13, wherein a determinant det (A) of the Cauchy matrix is defined by Equation below:

$$\det A = \frac{\prod_{0 \leq i < j < n}(x_i + x_j)(y_i + y_j)}{\prod_{0 \leq i,j < n}(x_i + y_j)}$$

where $x_i$ and $y_j$ are elements of a Galois Field, k is a size of an information message or a length of an information bit, n is a size of an encoded information message or a length of an encoded bit, and i, j are indexes indicating array elements.

15. The decoding apparatus of claim 11, wherein each element of the inverse matrix of the Cauchy submatrix is defined by Equation below in order to express a symbol in a Galois Field:

$$a_{ij} = \frac{\prod_{k=0}^{s-1}(x_j+y_k) \cdot \prod_{k=0}^{s-1}(x_k+y_j)}{(x_j+y_i) \cdot \prod_{k=0,\ldots,s-1, k \neq j}(x_j+x_k) \cdot \prod_{k=0,\ldots,s-1, k \neq i}(y_i+y_k)}$$

where s is a size of the Cauchy submatrix, and $a_{ij}$ is an element of an inverse matrix of the Cauchy submatrix that is positioned at an i-th row and a j-th column.

16. The decoding apparatus of claim 11, wherein the updated at least one parity symbol is generated by excluding parity symbols corresponding to received data symbols from the at least one parity symbol.

17. The decoding apparatus of claim 11, wherein the number of at least one lost data symbol is generated by multiplying the inverse matrix of the Cauchy submatrix by the updated at least one parity symbol.

18. An encoding apparatus in an electronic device, wherein the encoding apparatus is configured to:
receive at least one message vector;
encode the at least one message vector parallel using a generation matrix comprising a plurality of elements in a form of a Cauchy matrix form configured to prevent repetition of redundant data;
convert the at least one message vector to at least one codeword vector comprising the at least one message vector and a parity vector based on the encoded at least one message vector; and
output the at least one codeword vector,
wherein each of the plurality of elements is determined based on at least one of first sets including Galois Field elements and at least one of second sets including Galois Field elements, and
wherein each of the Galois Field elements included in the at least one of first sets is different from each other and each of the Galois Field elements included in the at least one of second sets is different from each other.

19. The encoding apparatus of claim 18, wherein the generation matrix is defined by Equation below:

$$GM = \begin{bmatrix} 1 & 0 & \ldots & 0 & 0 \\ 0 & 1 & \ldots & 0 & 0 \\ \ldots & \ldots & \ldots & \ldots & \ldots \\ 0 & 0 & \ldots & 1 & 0 \\ 0 & 0 & \ldots & 0 & 1 \\ \frac{1}{x_0+y_0} & \frac{1}{x_0+y_1} & \ldots & \frac{1}{x_0+y_{k-2}} & \frac{1}{x_0+y_{k-1}} \\ \frac{1}{x_1+y_0} & \frac{1}{x_1+y_1} & \ldots & \frac{1}{x_0+y_{k-2}} & \frac{1}{x_0+y_{k-1}} \\ \ldots & \ldots & \ldots & \ldots & \ldots \\ \frac{1}{x_{n-k-2}+y_0} & \frac{1}{x_{n-k-2}+y_1} & \ldots & \frac{1}{x_{n-k-2}+y_{k-2}} & \frac{1}{x_{n-k-2}+y_{k-1}} \\ \frac{1}{x_{n-k-1}+y_0} & \frac{1}{x_{n-k-1}+y_1} & \ldots & \frac{1}{x_{n-k-1}+y_{k-2}} & \frac{1}{x_{n-k-1}+y_{k-1}} \end{bmatrix}$$

where x, y are elements of a Galois Field, k is a size of an information bit, n is a size of a parity bit, and i, j are array elements.

20. The encoding apparatus of claim 19, wherein the generation matrix is configured to meet a condition of Equation below in order to prevent repetition of redundant data:

$\forall i \in \{0 \ldots n-k-1\}, \forall j \in \{0 \ldots k-1\}: x_i+y_j \neq 0$; and $\forall i,j \in \{0 \ldots n-k-1\}, i \neq j: x_i \neq x_j; \forall i,j \in \{0 \ldots k-1\}, i \neq j; y_i \neq y_j.$

* * * * *